United States Patent [19]

Dunn et al.

[11] 4,452,679
[45] Jun. 5, 1984

[54] SUBSTRATE WITH CHEMICALLY MODIFIED SURFACE AND METHOD OF MANUFACTURE THEREOF

[75] Inventors: Terry S. Dunn, Raleigh; David B. Montgomery; Joel L. Williams, both of Cary, all of N.C.

[73] Assignee: Becton Dickinson and Company, Paramus, N.J.

[21] Appl. No.: 526,297

[22] Filed: Aug. 25, 1983

Related U.S. Application Data

[63] Continuation-in-part of Ser. No. 309,525, Oct. 7, 1981.

[51] Int. Cl.$^3$ .................. C07C 17/00; B05D 3/06
[52] U.S. Cl. .................. 204/164; 204/165; 204/168; 427/38
[58] Field of Search .............. 204/164, 165, 168, 169, 204/170, 173, 174, 177; 427/39, 38, 40; 425/174.8

[56] References Cited

U.S. PATENT DOCUMENTS

| | | | |
|---|---|---|---|
| 3,341,352 | 9/1967 | Ehlers | 204/177 |
| 3,536,602 | 1/1967 | Jones et al. | 204/164 |
| 3,591,477 | 7/1971 | Pomerantz | 204/164 |
| 3,962,057 | 6/1976 | Bartz | 204/165 |
| 4,317,844 | 3/1982 | Carlson | 427/39 |
| 4,334,844 | 6/1982 | Tanaka | 427/39 |

*Primary Examiner*—T. Tung
*Assistant Examiner*—Nathan S. Thane

[57] ABSTRACT

A method for providing specific chemical functional groups on a substrate surface is provided. In the method a vaporized material is introduced into a reaction zone to produce a plasma. Selective species of the plasma are prevented from contacting the substrate surface while the remaining species are contacted with the substrate.

14 Claims, 8 Drawing Figures

SUBSTRATE WITH CHEMICALLY MODIFIED SURFACE AND METHOD OF MANUFACTURE THEREOF

The present application is a continuation-in-part of co-pending application Ser. No. 309,525, filed Oct. 7, 1981.

The present invention relates generally to substrates with chemically modified surfaces. More particularly, the invention relates to the modification of the surfaces of organic and inorganic substrates by subjecting the surface of the substrate to selected species of a plasma of a vaporized material.

The use of a plasma to modify the surface of various substrates is well known. Plasmas are defined as highly reactive and energetic mixtures of ions, electrons and photons with properties distinct from ordinary gases.

Among the applications for which such man made plasmas have been used or proposed are the modification of the surfaces of inorganic and organic substrates. Such modification is generally effected by forming a plasma of inorganic or organic gaseous species and contacting the substrate with the full spectrum of active species from the plasma that is formed. It is known that the full spectrum of active species available in the plasma are operable to modify the surface of a substrate, such as by the formation of a polymeric coating thereon or by the grafting of a variety of chemical species to the substrate surface. Quite often, the material from which the plasma is formed is selected with respect to the substrate with which it will or can interact and the modification of the surface which results by contacting the substrate with the plasma is not a modification which is desired or which produces a desired result. For example, air or oxygen plasmas have been used to modify the surface of polymeric materials, such as polyethylene, for the purpose of increasing their adhesive or printing property but the modified surfaces are not useful for other purposes, such as tissue culture growth.

The present invention provides a process for the modification of organic and inorganic substrates, including polymeric materials and metals, regardless of thickness, and which is independent of substrate composition, so as to provide specific chemical functional groups on the surface of the substrate. Such process is suitable for any application requiring specific surface chemistry, such as tissue culture products and protein-antibody binding or coupling to surfaces for purposes such as immunoassay.

Thus, in accordance with the present invention, there are provided processes for irreversibly modifying the surfaces of organic and inorganic substrates. More particularly, in accordance with the present invention, the surfaces of organic and inorganic substrates are irreversibly modified by grafting specific chemical functional species onto the surface of the substrate by contacting such surfaces with selected components of a plasma of a vaporized material. The plasma used is a low energy or cold plasma, such as an electrical glow discharge plasma. The surfaces which are modified in accordance with this invention have specific chemical functional groups grafted onto the surface of the substrate and provide suitable surface chemistry for applications such as tissue culture products and protein-antibody binding or coupling.

In a first embodiment of the present invention there is provided a process for modifying the surface of organic materials, specifically organic polymeric materials comprising;

Providing an organic substrate within a reaction zone.

Introducing a vaporized material into the reaction zone. The material is one which is suitable for providing a plasma such as under electrical discharge conditions. Suitable materials include, but are not limited to oxygen, nitrogen, halogen, sulfur and compounds thereof.

Subjecting the material in the reaction zone to an ionizing process. A plasma is formed which includes neutral material, positive ions of the material, negative ions of the material, electrons and photons.

Preventing at least one of the components of the plasma from contacting the surface of the organic substrate in the reaction zone. Contacting the surface of the substrate with the remainder of the components of the plasma in the reaction zone, and Forming specific functional groups of the material on the surface of the organic substrate.

The present invention is based on the discovery that exclusion of various reactive species of a plasma from contact with a substrate in the presence of the plasma can be employed to provide specific chemical functional groups on the surface of the substrate.

The present invention will be more fully described with reference to the drawings, wherein FIG. 1 is a schematic diagram of apparatus which can be employed in the practice of the invention, FIG. 2 is a perspective view of a sample holder used in the apparatus of FIG. 1.

Four types of plasmas can be generated; these are thermal plasmas, discharge plasmas, beam plasmas (such as ion beams and electron beams) and hybrid plasmas such as corona discharges. The preferred plasma for use in the method of the present invention is a discharge plasma generated under evacuated conditions of from about 10 mTorr to about 1 Torr. The plasma may be generated between two flat plates or with a helical coil. The plasma conditions suitable for use in the present invention are to be distinguished from corona discharge plasmas which are not suitable. Corona discharge plasmas are non-uniform plasmas which are usually generated from a point source at ambient temperature and pressure. Suitable plasmas can be generated by use of DC or AC power sources having a frequency from zero through the microwave range at power levels from about 1.0 W to about 10 kW. Although not limited to high frequency sources, such as radiofrequency (r.f.) sources, plasmas of this type are particularly useful for the method and articles of the present invention. Radiofrequency plasmas are particularly suitable for uniformly modifying the surface of more complex article shapes, such as tubing and other enclosures, for which DC and low frequency r.f. plasmas are not satisfactory.

Figure 1:
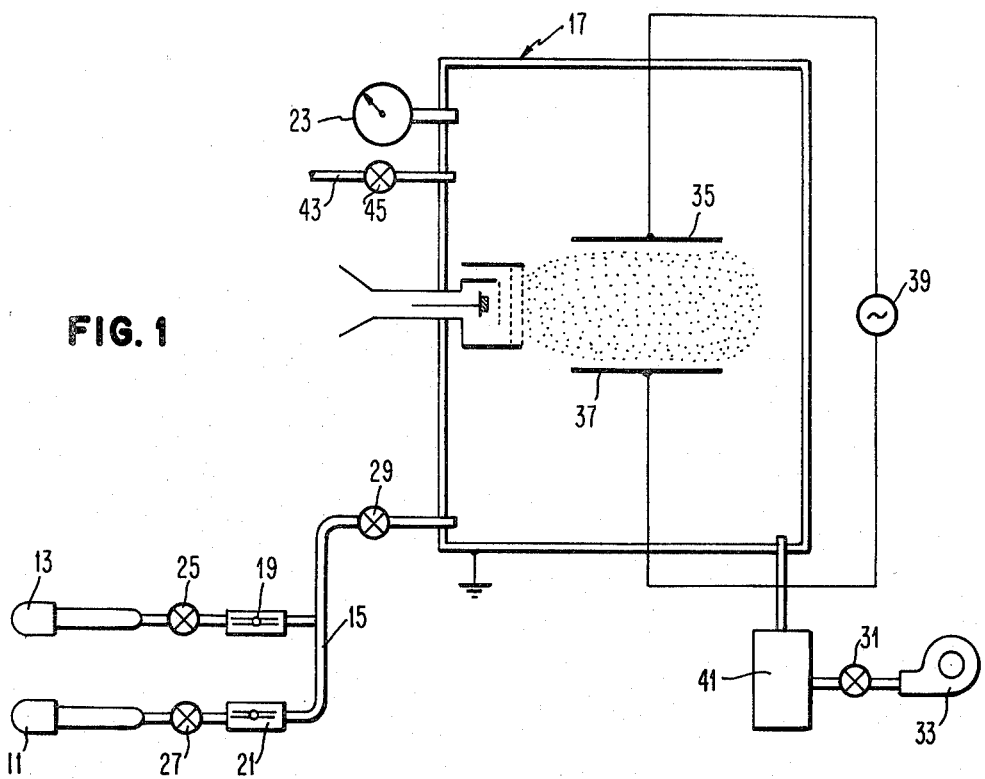

In general, the r.f. plasmas suitable for use in the present invention are generated at a frequency of from about 1.0 to about 300 MHz at a power to initiate breakdown, such as from about 5 to about 1000 watts at pressures ranging from 0.001 to 10 Torr. The articles are usually subjected to the r.f. plasma for a period of from about 0.1 sec to about 120 minutes, although longer and shorter periods can be used. The plasma treatment can be followed by a quench cycle designed to provide an atmosphere suitable for reacting with residual active polymer species at or near the surface with pressures ranging from about 0.5 Torr to about 760 Torr for time periods of from about 1 second to about 4 hours. The r.f. plasma can be generated between two flat plates, as shown in FIG. 1, or can be generated with a helical coil, as shown in U.S. Pat. No. 4,188,426.

Referring now to the figures, other features and advantages of the present invention will be described with reference to a particular material suitable for forming a plasma, i.e. oxygen. It should be understood, however, that the processes of the invention are equally suitable for use with other materials capable of forming a plasma, such as nitrogen, sulfur, ammonia, halogen, compounds thereof and mixtures thereof.

As shown in FIG. 1 there is provided a first gas reservoir 11, a second gas reservoir 13 with conduit means 15 to deliver either or both a first gas and a second gas to a vacuum chamber 17. Flow meters 19 and 21 are provided for measuring gas flow rate and a vacuum gauge 23 is provided to monitor the pressure within the vacuum chamber 17. Valves 25, 27 and 29 are provided to regulate the flow rate of the gas in the first gas reservoir 11, the second gas reservoir 15 and the gas entering the vacuum chamber 17. Prior to use, the vacuum chamber 17 is evacuated by opening valve 31 to vacuum pump 33. Suitable electrodes 35 and 37 are connected to a suitable voltage source 39. The reactor system also includes a trap 41, vent conduit 43 and its valve 45.

Figure 2:
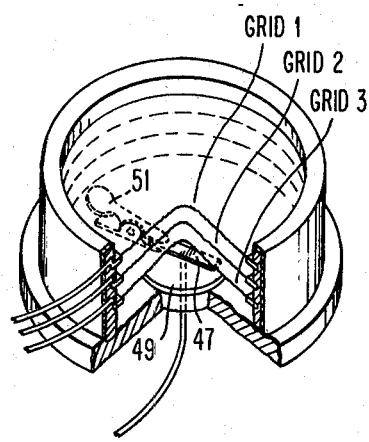

As best seen in FIG. 2, a substrate 47 to be treated in accordance with the invention is placed in a sample holder 51 and disposed within the vacuum chamber 17. The sample holder includes a grid assembly of three grids, designated grid 1, grid 2 and grid 3. A collector 49 which can be electrically biased is disposed on the other side of the sample from the grid system. The sample is held in place between grid 3 and the collector by means of a suitable holder 51.

In operation, any of the three grids or the collector can be biased with positive or negative charge to repel selective components of a plasma generated between the electrodes 35 and 37. The substrate in the sample holder is then subjected to reaction with those components of the plasma which are not repelled.

The method described above for selecting components of the plasma is based on the electrical charge of the components and is suitable for preventing either the positive or the negative components of the plasma from reacting with the surface of the substrate. Other physical parameters of the plasma components, such as mass or response to a magnetic field, can be used to select desired components. For example, apparatus which could be used to prevent neutral components of the plasma from reacting with the surface involves the principle that charged species are deflected from forward motion when injected into a magnetic field normal to the direction of motion whereas neutral species are unaffected by the presence of the magnetic field. Neutral species, positive, or negative species alone would interact with the surface depending on placement of the surface relative to the direction of incidence. Such apparatus is well known in the art with the magnetic field formed by that of a conventional mass spectrometer magnet such as is shown in U.S. Pat. No. 3,341,352.

The present invention can be employed to alter the surfaces of solid polymeric materials, including natural and synthetic addition and condensation polymers. Such polymeric materials include polyolefins, such as polyethylene, polypropylene, polyisobutylene and ethylene-alpha-olefin copolymers, acrylic polymers and copolymers, such as polyacrylate, polymethylmethacrylate, polyethylacrylate; vinyl halide polymers and copolymers, such as polyvinyl chloride; polyvinyl ethers, such as polyvinyl methyl ether; polyvinylidene halides, such as polyvinylidene fluoride and polyvinylidene chloride; polyacrylonitrile, polyvinyl ketones; polyvinyl aminodes; polyvinyl aromatics, such as polystyrene, polyvinyl esters, such as polyvinyl acetate; copolymers of vinyl monomers with each other and olefinds, such as ethylenemethyl methacrylate copolymers, acrylonitrile-styrene copolymers, ABS resins, and ethylene-vinyl acetate copolymers; natural and synthetic rubbers, including butadiene-styrene copolymers, polyisoprene, synthetic polyisoprene, polybutadiene, butadiene-acrylonitrile copolymers, polychloroprene rubbers, polyisobutylene rubber, ethylene-propylenediene rubbers, isobutylene-isoprene copolymers and polyurethane rubbers; polyamides, such as Nylon 66 and polycaprolactam; polyesters such as polyethylene terephthalate, alkyd resins; phenol-formaldehyde resins; urea-formaldehyde resins, malamine-formaldehyde resins; polycarbonates; polyoxymethylenes; polyimides; polyethers; epoxy resins, polyurethanes; wool; cotton; silk; rayon; rayon-triacetate; cellulose, cellulose acetate, cellulose butyrate; cellulose acetate-butyrate; cellophane; cellulose nitrate; cellulose propionate; cellulose ethers; and carboxymethyl cellulose.

Inorganic materials, the surfaces of which can be modified in accordance with the invention, include nonmetals, such as graphite; metals, such as iron, aluminum, tin, copper and nickel; metal and other elemental oxides; such as magnesium oxide, silica, alumina and titania; minerals, such as clay, pyrite and asbestos; salts, such as sodium chloride and calcium carbonate; and such synthetic compositions as glass and refactories.

The substrates, whether organic or inorganic, can be any shape, such as continuous or particulate, porous or impervious, and large or small. The invention can be employed for altering the surfaces of crystals, powders, plates, strips, films, sheets, wire, fibers, fabrics, filaments, tubing, and cast, extruded or compressed articles, and the like.

In respect to oxygen, the plasma species formed when oxygen is caused to undergo electrical glow discharge conditions are as set forth hereinbelow:

TABLE 1

| | OXYGEN PLASMA SPECIES | |
|---|---|---|
| Species* | Atomic Oxygen | Molecular Oxygen |
| n (neutral) | $\cdot$O$\cdot$ | $^3O_2\,(^3\Sigma_g)$, $^1O_2\,(^1\Delta_g)$ |
| n+ (positive) | $\cdot\dot{O}\cdot^+$, $\cdot\dot{O}\cdot^{+2}$ | $O_2\cdot^+$, $O_2^{+2}$ |
| n− (negative) | $O\cdot^-$, $O^{-2}$ | $O_2\cdot^-$, $O_2^{-2}$ |

*All species = n, n+, n−, e−, hν

Figure 3:
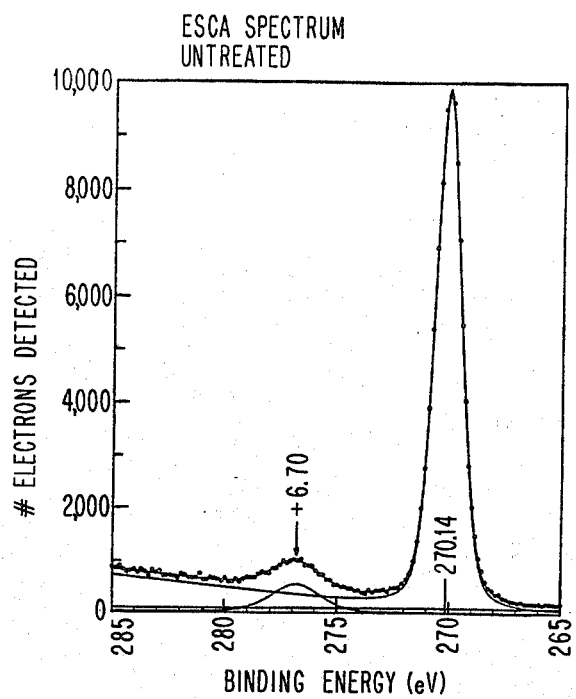
Figure 4:
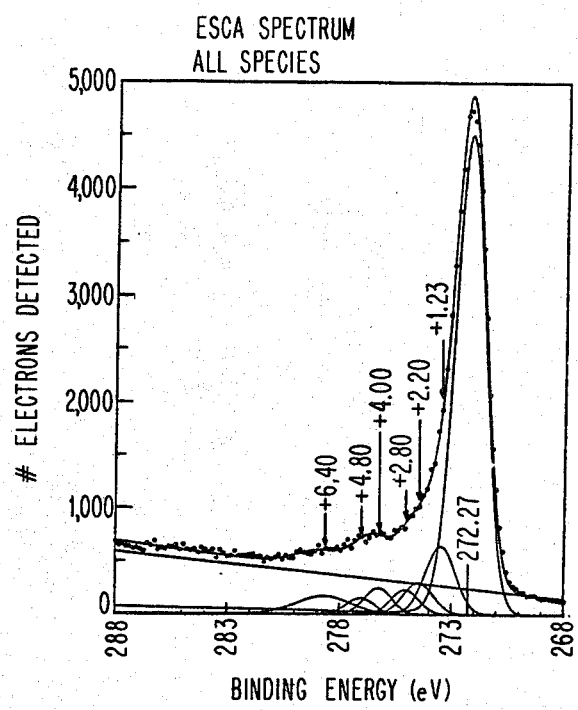

In the following examples, a substrate of a polystyrene strip is subjected to various components of an oxygen plasma. The substrate is then examined by x-ray photoelectron spectroscopy (ESCA) to determine the nature of the chemical functional groups on the surface of the polystyrene substrate. In recent years, ESCA has evolved into a powerful tool available for the investigation of polymer surfaces to a depth of 100 Å. ESCA is used to measure the binding energy shift and the results are tabulated by a plot which discloses the binding energy shift relative to particulate functional groups. In Table 2 hereinbelow the binding energy shift range for various chemical functional groups introduced by an oxygen plasma is shown. The binding energy shift range figures set forth in Table 2 are established by reference to standard curves relating to ESCA technique. In particular, see C. Wagner, W. Riggs, L. Davis, J. Moulder, and G. Muilenberg 1979. *Handbook of X-Ray Photoelectron Spectroscopy*, Perkin-Elmer Corporation, Physical Electronics Division, Minnesota; D. T. Clark and A. Dilks, *J. Polym. Sci. Polym. Chem. Ed.*, 17. 957 (1979) and D. T. Clark, B. J. Cromarty, and A. Dilks, *J. Polym. Sci. Polym. Chem. Ed.* 16, 3173 (1978) for much of the background data for the study of surface-oxidized hydrocarbon polymers by ESCA techniques.

istry from treatment with the full spectrum of active species of the oxygen plasma is shown in FIG. 4. The surface chemistry of an untreated polystyrene specimen as is shown in FIG. 3.

EXAMPLE 2

Figure 5:
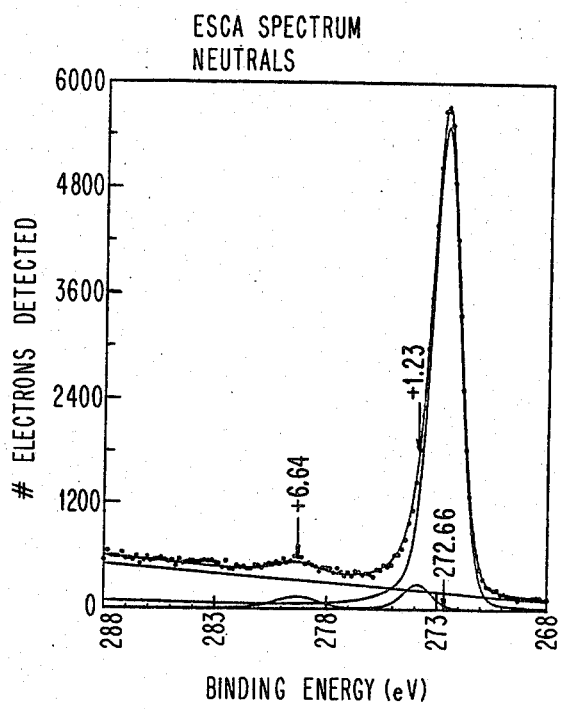

The polystyrene surface was bombarded with only neutral species of the oxygen plasma by biasing grid 3 to +6 v to repel positive ions and by biasing the collector at −6 v to repel negative species. The current to the collector was less than 0.01 μA. The resulting surface chemistry of the sample is illustrated by the ESCA scan set forth in FIG. 5.

EXAMPLE 3

Figure 6:
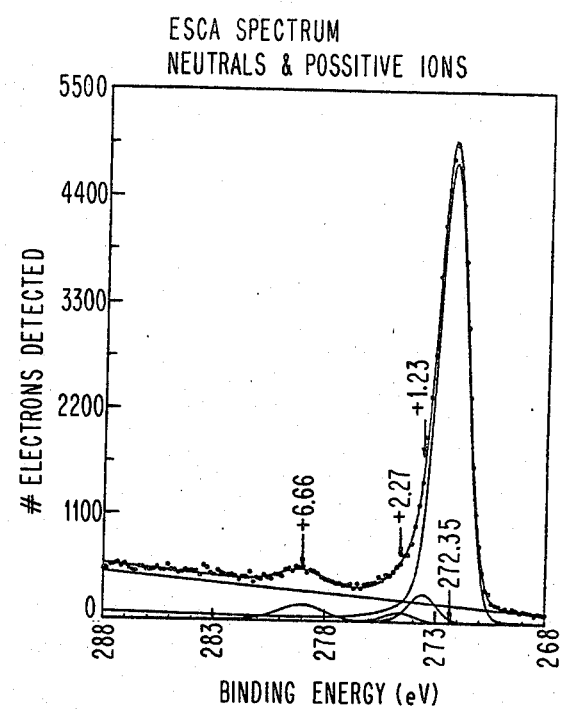

A polystyrene substrate was then subjected to treatment with neutrals and positive ions from an oxygen plasma by maintaining grid 3 at −9 v and the collector at −60 v. The resulting surface chemistry of the sample is illustrated in the ESCA scan of FIG. 6.

TABLE 2
BINDING ENERGY SHIFTS ASSOCIATED WITH VARIOUS CHEMICAL SPECIES INTRODUCED BY OXYGEN PLASMA

| | Binding Energy Shift Range (eV) | | | | | | | |
|---|---|---|---|---|---|---|---|---|
| 1.2–1.3 | 1.4–1.6 | 1.7–1.9 | 2.0–2.3 | 2.5–2.9 | 3.8–4.3 | 4.6–4.9 | 6.0–6.2 | 6.4–6.7 |
| Oxidative Functional Group: Phenoxide (−O−C₆H₅) | Hydroxyl −CH−OH; Ether −CH₂−O− | Epoxide CH\O/CH₂; Methoxide −C(=O)−O−C | Diperoxide −C−O−O−C | Carbonyl C=O | Ester C=O, O, C; Carboxyl C=O, O, H | Triether O−C(O)−O | Carbonate O−C(=O)−O | Ring Structure x-x* |

FIG. 3 shows an ESCA scan of an untreated polystyrene substrate. The π-π* peak refers to the ring structure peak. The only other peak is the C—C structure which is the predominant feature of the untreated polystyrene substrate.

FIG. 4 shows the ESCA scan of a polystyrene substrate subjected to exposure to an oxygen plasma containing all of the components of an oxygen plasma. It can be seen that many of the functional groups connected with an oxygen plasma as shown in Table 2 are present in the polystyrene substrate subjected to the full component of the species present in the oxygen plasma.

The following examples illustrate various features of the invention wherein a polystyrene substrate is subjected to a portion of the species of an oxygen plasma.

EXAMPLE 1

A sample holder 51 containing a polystyrene sample 47 was located at a distance of 6.35 cm from parallel plate electrodes 35 and 37 in a vacuum chamber 17. The parallel plate electrodes were separated by 21.6 cm. The system was initially pumped to a pressure of 3 microns for 15 minutes. The electrode voltage was maintained at 395 volts RMS at a frequency of 60 Hz during the 3.0 minute treatment with no biased potential applied to the grid assembly or the collector. All grids floated at −2.5 v with a collector current of −0.25 μA. Oxygen gas was admitted into the vacuum chamber at a flow rate of 5 cc/min while maintaining the pressure of 6 microns to establish an oxygen plasma. The resulting surface chem-

EXAMPLE 4

Figure 7:
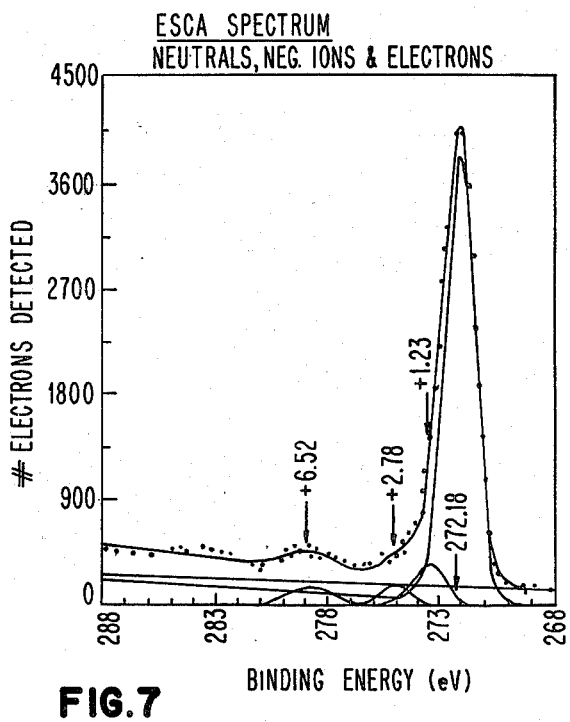
FIG. 3 through FIG. 7 are X-ray photoelectron spectroscopy scans (ESCA) of various substrates, some of which have been treated in accordance with the present invention.

For plasma treatment with negative ions, electrons and neutrals, grid 3 was maintained at a voltage of +1.0 v with a collector voltage of +6 v and collector current of −0.8 μA. The resulting surface chemistry of the sample is illustrated in FIG. 7.

EXAMPLE 5

The ability to selectively control the extent of oxidation of a surface is demonstrated by varying the energy of the incident ionic species. The following samples were prepared:

| SPECIES | ENERGY | GRID CONFIGURATION | COLLECTOR CURRENT |
|---|---|---|---|
| n+, n | K.E.$_{ions}$ < 4 ev | GRID 3 = −3.0 volts<br>V$_C$ = −6.0 volts | +0.05 μA |
| n+, n | K.E.$_{ions}$ < 10 ev | GRID 3 = −6.0 volts<br>V$_C$ = −15 volts | +0.22 μA |
| n+, n | K.E.$_{ions}$ < 50 ev | GRID 3 = −9.0 volts<br>V$_C$ = −60 volts | > +0.30 μA |
| n−, e−, n | K.E.$_{e-}$ < 8 ev | GRID 3 = +1.0 volts<br>V$_C$ = +6.0 volts | −0.8 μA |
| n, e−, n | K.E.$_{e-}$ < 50 ev | GRID 3 = +8.0 volt<br>V$_C$ = +60.0 volts | < −1.0 μA |

Figure 8:
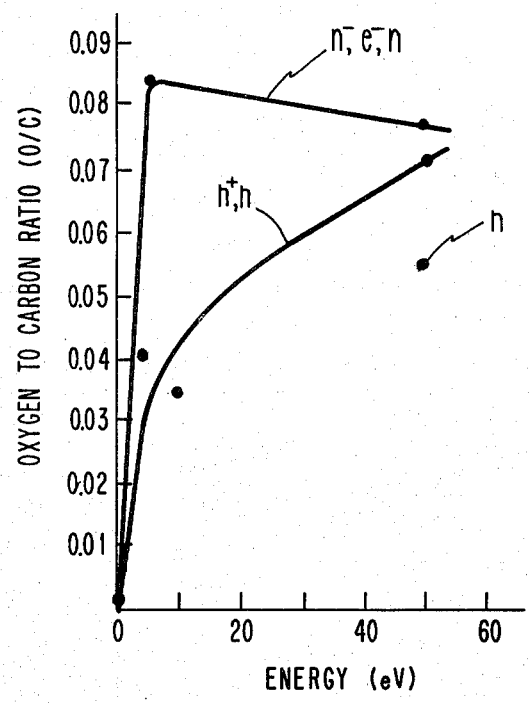
FIG. 8 is a plot illustrating differences in oxygen to carbon ratios which occur at various energy levels with different species of plasma.

The measured surface oxygen to carbon ratio, O/C, is dependent on both the energy and the ionic species as illustrated in FIG. 8.

The binding energy shifts representative of the various samples of the above examples are set forth in Table 3 hereinbelow.

It is readily apparent from an examination of Table 3 that the present invention can be used to specifically insert various chemical functional groups on substrate surfaces by the process of the invention.

TABLE 3

MEASURED BINDING ENERGY SHIFTS FOR SELECTED TREATMENTS WITH OXYGEN PLASMA

| | Binding Energy Shift Range (eV) | | | | | | | | |
|---|---|---|---|---|---|---|---|---|---|
| | 1.2–1.3 | 1.4–1.6 | 1.7–1.9 | 2.0–2.3 | 2.5–2.9 | 3.8–4.3 | 4.6–4.9 | 6.0–6.2 | 6.4–6.7 |
| Functional Group | Phenoxide | Hydroxyl Ether | Epoxide Methoxide | Diperoxide | Carbonyl | Ester Carboxyl | Triether | Carbonate | Ring Structure |
| Untreated | | | | | | | | | 6.69 |
| All species | 1.23 | | | 2.20 | 2.80 | 4.0 | 4.80 | | 6.40 |
| Neutrals | 1.23 | | | | | | | | 6.64 |
| Neutrals and Positive Ions | 1.23 | | | 2.27 | | | | | 6.66 |
| Neutrals, Negative Ions and Electrons | 1.23 | | | | 2.78 | | | | 6.52 |

What is claimed is:

1. A method for providing specific chemical functional groups on the surfaces of organic substrates comprising;
   (a) providing an organic substrate within a reaction zone
   (b) introducing a vaporized material into said reaction zone, said material being suitable for providing a plasma
   (c) subjecting said material to plasma producing conditions, whereby the plasma comprises neutral material, positive ions of said material, negative ions of said material, electrons and photons
   (d) preventing at least one of the components of said plasma from contacting the surface of said organic substrate,
   (e) contacting the surface of said substrate with the remainder of said components of said plasma, and
   (f) forming specific functional groups of said material on the surface of said organic substrate.

2. A method in accordance with claim 1 wherein said plasma is produced under electrical discharge conditions.

3. A method in accordance with claim 1 wherein said vaporized material is selected from the group consisting of oxygen, nitrogen, halogen, sulfur, compounds thereof and mixtures thereof.

4. A method in accordance with claim 3 wherein said vaporized material is oxygen and compounds thereof.

5. A method in accordance with claim 3 wherein said vaporized material is nitrogen and compounds thereof.

6. A method in accordance with claim 3 wherein said vaporized material is halogen and compounds thereof.

7. A method in accordance with claim 3 wherein said vaporized material is sulfur and compounds thereof.

8. A method for providing specific chemical functional groups on the surfaces of inorganic substrates comprising
   (a) providing an inorganic substrate within a reaction zone
   (b) introducing a vaporized material into said reaction zone, said material being suitable for providing a plasma
   (c) subjecting said material to a plasma producing condition, whereby the plasma comprises neutral material, positive ions of said material, negative ions of said material, electrons and photons
   (d) preventing at least one of the components of said plasma from contacting the surface of said inorganic substrate,
   (e) contacting the surface of said substrate with the remainder of said components of said plasma, and
   (f) forming specific functional groups of said material on the surface of said inorganic substrate.

9. A method in accordance with claim 8 wherein said plasma is produced under electrical discharge conditions.

10. A method in accordance with claim 8 wherein said vaporized material is selected from the group consisting of oxygen, nitrogen halogen, sulfur, compounds thereof and mixtures thereof.

11. A method in accordance with claim 10 wherein said vaporized material is oxygen and compounds thereof.

12. A method in accordance with claim 10 wherein said vaporized material is nitrogen and compounds thereof.

13. A method in accordance with claim 10 wherein said vaporized material is halogen and compounds thereof.

14. A method in accordance with claim 10 wherein said vaporized material is sulfur and compounds thereof.

* * * * *